United States Patent [19]

Zeller

[11] Patent Number: 4,770,899
[45] Date of Patent: Sep. 13, 1988

[54] METHOD OF COATING COPPER CONDUCTORS ON POLYIMIDE WITH A CORROSION RESISTANT METAL, AND MODULE PRODUCED THEREBY

[75] Inventor: Faith M. Zeller, Eagan, Minn.

[73] Assignee: Unisys Corporation, Detroit, Mich.

[21] Appl. No.: 60,234

[22] Filed: Jun. 10, 1987

[51] Int. Cl.$^4$ ............................................... B05D 5/12
[52] U.S. Cl. ........................................ 427/96; 427/98; 427/306; 427/307; 427/443.1
[58] Field of Search ................. 427/96, 98, 443.1, 306, 427/307

[56] References Cited

U.S. PATENT DOCUMENTS

| | | | |
|---|---|---|---|
| 3,753,667 | 8/1973 | Metzger | 427/443.1 |
| 3,821,016 | 6/1974 | De Angelo | 427/443.1 |
| 3,878,007 | 4/1975 | Feldstein | 427/98 |
| 4,568,562 | 2/1986 | Phillips | 427/443.1 |
| 4,600,609 | 7/1986 | Leever | 427/443.1 |

OTHER PUBLICATIONS

Ronald J. Jensen, John P. Cummings and Harshadrai Vora, "Copper/Polyimide Materials Systems for High Performance Packaging", IEEE Trans. Components, Hybrids and Manuf. Technology, vol. CHMT-7, No. 4, Dec. 1984, pp. 384-393.

Primary Examiner—Shrive P. Beck
Assistant Examiner—Vi D. Dang
Attorney, Agent, or Firm—Charles J. Fassbender; L. Joseph Marhoefer

[57] ABSTRACT

A module, for interconnecting integrated circuits, is comprised of a substrate, a layer of polyimide disposed thereon, and a plurality of spaced apart copper conductors on the layer of polyimide. This module is dipped into a solution of palladium chloride, thereafter it is dipped into a solution of sodium hydroxide, and thereafter it is dipped into an electroless plating solution for cobalt. As a result, a film of cobalt is deposited on all exposed surfaces of the copper conductors, but no cobalt is deposited on the exposed polyimide surface between the conductors. This cobalt film protects the copper conductors from corrosion, and it does not short the conductors together.

9 Claims, 2 Drawing Sheets

METHOD OF COATING COPPER CONDUCTORS ON POLYIMIDE WITH A CORROSION RESISTANT METAL, AND MODULE PRODUCED THEREBY

BACKGROUND OF THE INVENTION

This invention relates to methods for fabricating modules which interconnect integrated circuits with patterned layers of copper conductors that are separated by layers of polyimide; and more particularly, it relates to methods of coating the copper conductors such that they do not corrode.

In the prior art, one module of the type to which this invention relates is described in an article entitled "Copper/Polyimide Systems for High Performance Packaging", *IEEE Transactions on Components, Hybrids & Manufacturing Technology*, Volume 7, No. 4, December, 1984, by H. Vora, et al. As described in this article, the conductors are formed on an underlying layer of polyimide by sputtering thereon, (1) an unpatterned layer of chromium, (2) an unpatterned layer of copper on the chromium, and (3) an unpatterned layer of chromium on the copper. This Cr/Cu/Cr structure is then patterned in a conventional fashion by means of photoresist and a wet etch. Then the resulting patterned Cr/Cu/Cr conductors are covered with an overlying layer of polyimide. All of the process steps are then repeated to form additional Cr/Cu/Cr conductor layers which are separated by polyimide layers.

However, a problem with the above described interconnect structure is that no chromium covers the sidewalls of the patterned Cr/Cu/Cr conductors. Consequently, the copper in the sidewalls corrodes when it is covered by the overlying polyimide layer. This corrosion occurs because water is given off when the overlying polyimide layer is cured, and because the curing process occurs at a high temperature (e.g., 300° C.).

To avoid this corrosion problem, silicon dioxide rather than polyimide could be used to cover the copper conductors. But silicon dioxide cannot be deposited over the conductors as smoothly as polyimide. Polyimide is spun on in a liquid form and then cured, and this spinning motion smooths out the polyimide surface. By comparison, silicon dioxide is deposited by a chemical vapor. An insulating layer with a smooth surface is very useful since it allows alternate layers of copper conductors and insulator to be stacked on top of each other many times.

It has been considered by the present inventor that it would be very desirable to be able to pattern a layer of copper conductors on the underlying polyimide layer, and then electrolessly plate just the exposed copper surfaces with a material that resists corrosion. However, prior art electroless plating methods plate the polyimide along with the copper. Consequently, the copper conductors become shorted together and thereby make the interconnect structure useless.

Accordingly, a primary object of the invention is to provide a method of fabricating a module which electrically interconnects integrated circuits with copper conductors on polyimide layers in which all of the above problems are resolved.

BRIEF SUMMARY OF THE INVENTION

In one preferred process which the invention covers, the above object is achieved by providing a substrate, a layer of polyimide disposed thereon, and a plurality of spaced apart copper conductors on the layer of polyimide. This structure is dipped into a solution of palladium chloride, thereafter it is dipped into a solution of sodium hydroxide, and thereafter it is dipped into an electroless plating solution for cobalt. As a result, a film of cobalt is deposited on all exposed surfaces of the copper conductors, but no cobalt is deposited on the exposed polyimide surface between the conductors. This cobalt film protects the copper conductors from corrosion, and it does not short the conductors together.

BRIEF DESCRIPTION OF THE DRAWINGS

Various features and advantages of the invention are described in the Detailed Description in conjunction with the accompanying drawings wherein.

DETAILED DESCRIPTION OF THE INVENTION

Figure 1:
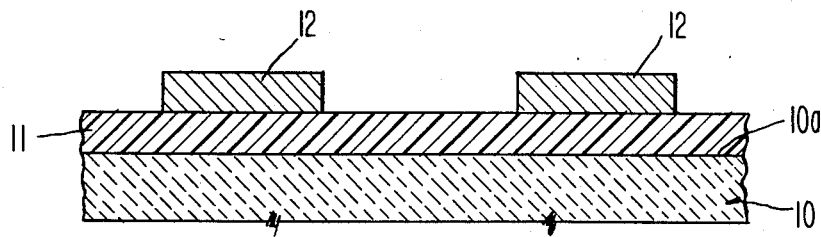
FIGS. 1, 2, 3, 4, 5, and 6 illustrate various stages of a fabrication process which occurs in accordance with the invention.

Referring now to the FIGS. 1 thru 6, a preferred process for fabricating the same will be described in detail. First, beginning with FIG. 1, it shows the structure with which the fabrication process starts. This structure includes a susbstrate 10 which has a substantially flat major surface 10a, a polyimide layer 11 which covers surface 10a, and patterned copper conductors 12 which are disposed on the polyimide layer.

Substrate 10 may be made of any semiconductor material such as silicon or germanium; or alternatively, it may be made of nonsemiconductor materials, such as ceramic or sapphire. Further, substrate 10 may have any desired thickness, and surface 10a may have any desired shape. For example, surface 10a may be square and one-quarter inch on a side, or it may be round and five inches in diameter.

Insulating layer 11 is comprised of polyimide and may have any desired thickness. Also, the copper conductors 12 can have any desired thickness, and they can be patterned to any desired shape. Suitably, the conductors 12 are shaped in a conventional fashion by disposing an unpatterned layer of copper on polyimide layer 11, photographically patterning a layer of photoresist on the copper layer, and removing the copper which is not covered by the photoresist with a chemical etchant.

Figure 2:
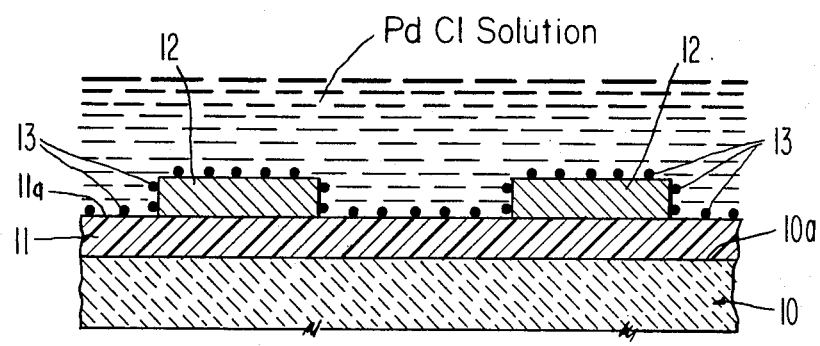

After the FIG. 1 structure is fabricated, the entire structure is completely dipped into a solution which contains a catalyst for electrolessly plating a corrosion resistant metal. This is shown in FIG. 2. One preferred solution is 0.05 grams of palladium chloride per liter of water and 0.1 milliliter of concentrated hydrochloric acid per liter of water. Here, palladium is a catalyst for electrolessly plating cobalt or nickel. Using this solution, the dipping preferably lasts five to fifteen seconds and occurs at room temperature.

Due to this dipping step, the copper surfaces are "activated" which means they will readily plate if they are immersed in an electroless plating solution. However, the inventor's experiments show that the polyimide surfaces 11a will also plate along with the copper surfaces at this stage of the process. Whether this is due to the above dipping step or due to the previous etching of the copper 12 or an inherent characteristic of the polyimide is unknown. In any case, the "dots" 13 in FIG. 2 indicate the "active" surface.

Figure 3:
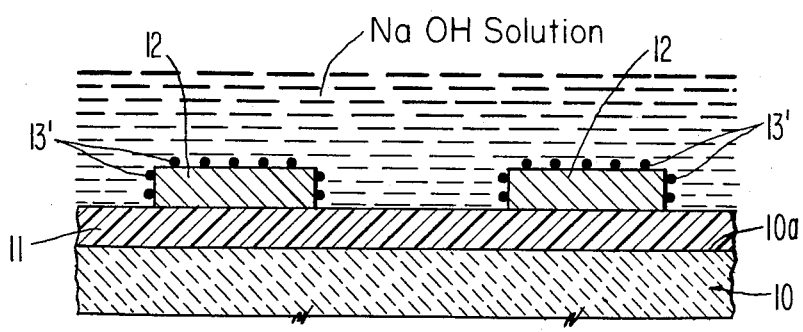

Next, as shown in FIG. 3, the above processed structure is dipped into a solution which contains a chemical agent that selectively "deactivates" the polyimide but not the copper. By "deactivate" is herein meant substantially delay or reduce the tendency to plate. One preferred solution is two to ten grams of sodium hydroxide per liter of water. Here, the hydroxide is the agent which performs the selective deactivation. Using this solution, the immersion preferably occurs at room temperature and lasts fifteen to sixty seconds. Selective deactivation is indicated in FIG. 3 by the "dots" 13' which are on only copper surfaces.

Following the step of FIG. 3, the resulting selectively deactivated structure is immersed into a solution for electrolessly plating a corrosion resistant metal. In one such solution for plating cobalt, the primary active ingredients are cobaltous sulfate and a reducing agent, dimethylamine borane. Preferably, the immersion in the plating solution lasts for about five to sixty seconds at 40° C.–65° C. As a result, the corrosion resistant metal 14 is deposited over all of the exposed surfaces of the copper conductors 12, but nothing is deposited on the exposed surface of the polyimide layer 11. This is shown in FIG. 4.

Figure 4:
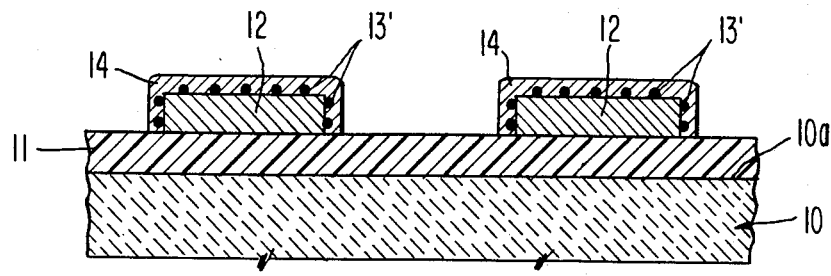

Thereafter the FIG. 4 structure is covered with a layer of polyimide 15. This is done in a conventional fashion by placing liquid polyimide on the FIG. 4 structure, spinning the liquid polyimide to form a substantially flat polyimide layer, and curing the polyimide at a temperature of about 300° C. During this step, no corrosion of the copper conductors 12 occurs because all of the copper surfaces which lie next to the newly cured polyimide layer are covered with the protectant film 14.

Figure 5:
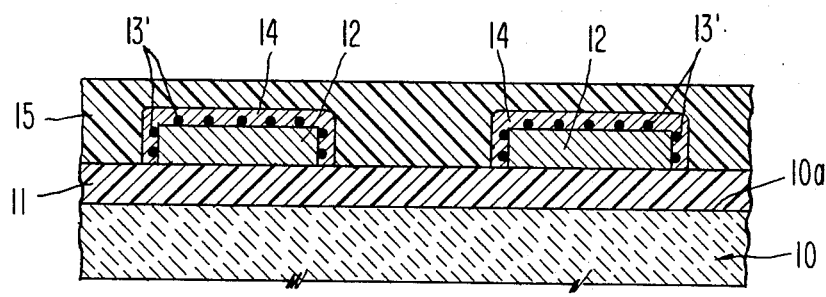
Figure 6:
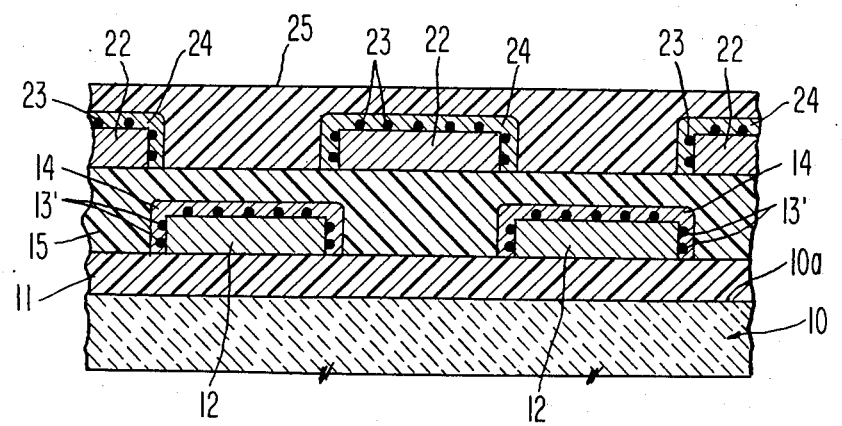

All of the above described steps can then be repeated on the FIG. 5 structure to form an embodiment which contains multiple layers of copper conductors, each of which is coated with a protectant film. One such embodiment is shown in FIG. 6. There, reference numeral 22 indicates an upper layer copper conductor; reference numeral 23 indicates the active surface; reference numeral 24 indicates a corrosion resistant film; and reference numeral 25 indicates a polyimide layer over the film 24.

A preferred process according to the invention, as well as the resulting interconnect module, has now been described in detail. In addition, however, many changes and modifications can be made to these details without departing from the nature and spirit of the invention.

For example, the solution concentrations and immersion times are not limited to the preferred ones which are given above. Also, various other electroless plating catalysts may be substituted for palladium. Also, in the selective deactivation step of FIG. 3, other agents, such as potassium hydroxide, can be used. Further, in the plating step of FIG. 4, other metals, such as nickel or gold-covered nickel, can be electrolessly plated. Also, in the steps of FIGS. 2, 3 and 4, the copper conductors need not be pure copper but can include a thin underlying layer of chromium or other suitable material which helps the copper adhere to the polyimide.

Accordingly, it is to be understood that the invention is not limited to the preferred above details but is defined by the appended claims.

What is claimed is:

1. A method of coating spaced apart copper conductors which lie on one layer of polyimide with a corrosion resistant metal without shorting said conductors together; said method including the steps of:
    dipping said one layer of polyimide and said copper conductors which lie thereon into a solution of a catalyst for electrolessly plating said metal;
    immersing, subsequent to said dipping step, said one layer of polyimide and said conductors which lie thereon into an hydroxide solution;
    bathing, subsequent to said immersing step, said one layer of polyimide and said conductors which lie thereon in an electroless plating solution for said metal.

2. A method according to claim 1 wherein said solution in said dipping step contains palladium as said catalyst.

3. A method according to claim 1 wherein said hydroxide in said immersing step is sodium-hydroxide.

4. A method according to claim 1 wherein said hydroxide in said immersing step is potassium-hydroxide.

5. A method according to claim 1 wherein said solution in said bathing step electrolessly plates cobalt.

6. A method according to claim 1 wherein said solution in said bathing step electrolessly plates nickel.

7. A method according to claim 1 wherein said dipping step lasts from five to fifteen seconds and said immersing step lasts from fifteen to sixty seconds.

8. A method of coating the surfaces of spaced apart conductors which lie on one layer of polyimide with a corrosion resistant metal without also coating the surface of said polyimide between said conductors; said method including the steps of:
    activating said surfaces of said conductors by immersing them into a solution of a catalyst for electrolessly plating said metal;
    immersing, subsequent to said activating step, all of said surfaces into another solution which includes a means for deactivating said polyimide surface while keeping said conductor surfaces active; and
    bathing all of said surfaces, subsequent to said immersing step, in an electroless plating solution for said metal.

9. A method according to claim 8 wherein said means for deactivating is a hydroxide.

* * * * *